United States Patent
Lopatin et al.

(10) Patent No.: US 6,291,348 B1
(45) Date of Patent: Sep. 18, 2001

(54) METHOD OF FORMING CU-CA-O THIN FILMS ON CU SURFACES IN A CHEMICAL SOLUTION AND SEMICONDUCTOR DEVICE THEREBY FORMED

(75) Inventors: Sergey Lopatin, Santa Clara; Krishnashree Achuthan, San Ramon, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/728,315

(22) Filed: Nov. 30, 2000

(51) Int. Cl.$^7$ ................................................ H01L 21/44
(52) U.S. Cl. ........................ 438/687; 438/240; 438/3; 438/681
(58) Field of Search ........................ 438/687, 678–681, 438/3, 104, 240

(56) References Cited

U.S. PATENT DOCUMENTS

| | | | |
|---|---|---|---|
| 5,004,720 | * | 4/1991 | Kobayashi et al. ........................ 505/1 |
| 5,210,069 | * | 5/1993 | Chiang et al. ............................. 505/1 |
| 5,268,354 | * | 12/1993 | Blanchet-Fincher et al. ............ 505/1 |
| 5,776,425 | * | 7/1998 | Wu et al. ................................ 423/618 |

FOREIGN PATENT DOCUMENTS

362286520 * 12/1987 (JP) ...................................... 423/210

* cited by examiner

Primary Examiner—Charles Bowers
Assistant Examiner—Thanh Nguyen

(74) Attorney, Agent, or Firm—LaRiviere, Grubman & Payne, LLP

(57) ABSTRACT

A method of fabricating a semiconductor device having a Cu—Ca—O thin film formed on a Cu surface by immersing the Cu surface into a unique chemical (electroless plating) solution containing salts of calcium (Ca) and copper (Cu), their complexing agents, a reducing agent, a pH adjuster, and surfactants; and a semiconductor device thereby formed for improving Cu interconnect reliability, electromigration resistance, and corrosion resistance. The method controls the parameters of pH, temperature, and time in order to form a uniform conformal Cu-rich Cu—Ca—O thin film, possibly containing carbon (C) and/or sulphur (S), for reducing electromigration in Cu interconnect lines by decreasing the drift velocity therein which decreases the Cu migration rate in addition to decreasing the void formation rate. The method for forming a semiconductor device having a copper-calcium-oxide (Cu—Ca—O) thin film on a copper (Cu) surface, the Cu surface having been formed by CVD, PVD, or electroplating, by treating the Cu surface in a chemical solution, comprises the steps of: (1) providing the chemical solution which comprises: (a) at least one calcium (Ca) ion source for providing a plurality of Ca ions; (b) at least one complexing agent for complexing the plurality of Ca ions; (c) at least one copper (Cu) ion source for providing a plurality of Cu ions; (d) at least one complexing agent for complexing the plurality of Cu ions; (e) at least one pH adjuster; (f) at least one reducing agent for facilitating deposition of the plurality of Cu ions; (g) at least one wetting agent for stabilizing the chemical solution; and (h) a volume of water, (a) through (g) being dissolved in (h); (2) immersing the Cu surface in said chemical solution, thereby forming the Cu—Ca—O thin film on the Cu surface; and (3) rinsing the Cu—Ca—O thin film formed on the Cu surface in water; drying the the Cu—Ca—O thin film formed on the Cu surface under a nitrogen flow ($GN_2$); and completing formation of the semiconductor device.

10 Claims, 2 Drawing Sheets

METHOD OF FORMING CU-CA-O THIN FILMS ON CU SURFACES IN A CHEMICAL SOLUTION AND SEMICONDUCTOR DEVICE THEREBY FORMED

CROSS-REFERENCE TO RELATED APPLICATION(S)

This application is related to concurrently filed and commonly assigned applications (serial numbers to be assigned) entitled:

"Chemical Solution for Cu—Ca—O Thin Film Formations on Cu Surfaces;"

"Method of Calcium Doping a Cu Surface Using a Chemical Solution and Semiconductor Device Thereby Formed;"

"Method of Reducing Carbon, Sulphur, and Oxygen Impurities in a Calcium-Doped Cu Surface and Semiconductor Device Thereby Formed;"

"Method of Reducing Electromigration in Copper Lines by Calcium-Doping Copper Surfaces in a Chemical Solution and Semiconductor Device Thereby Formed;" and "Method of Reducing Electromigration in Copper Lines by Forming an Interim Layer of Calcium-Doped Copper Seed Layer in a Chemical Solution and Semiconductor Device Thereby Formed."

TECHNICAL FIELD

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with barrier material using wet chemical methods.

BACKGROUND OF THE INVENTION

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma-enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum-copper alloy interconnect lines, the industry has been investigating the use of various barrier materials such as titanium-tungsten (TiW) and titanium nitride (TiN) layers as well as refractory metals such as titanium (Ti), tungsten (W), tantalum (Ta), and molybdenum (Mo) and their silicides.[2] Although the foregoing materials are adequate for Al interconnects and Al-Cu alloy interconnects, they have not been entirely effective with respect to all-Cu interconnects. Further, though CVD has been conventionally used for depositing secondary metal(s) on a primary metal interconnect surface, CVD is not a cost-effective method of doping Cu interconnect surfaces with calcium (Ca) ions.

[1] Peter Van Zant, Microchip Fabrication: A Practical Guide to Semiconductor Processing, 3$^{rd}$ Ed., p. 397 (1997).
[2] Id., at 392.

Some related art methods for forming metal oxide films as barrier materials generally include two electrochemical approaches: (1) electrochemical oxidation using an external electrical current (e.g., $La_{1-x}Sr_xMnO_3$ and $LaCoO_3$); and (2) electroless deposition (i.e., that which does not require an electrical current to drive the reaction (e.g., $PbO_2$, $MnO_2$, $Tl_2O_3$, NiO, $LaMnO_3$). Therefore, a need exists for a low cost and high throughput method of forming a Cu—Ca—O thin film on a Cu surface in a chemical solution which improves interconnect reliability, enhances electromigration resistance, and improves corrosion resistance.

BRIEF SUMMARY OF THE INVENTION

Accordingly, the present invention provides a method for forming a Cu—Ca—O thin film on a Cu surface by immersing the Cu surface into a unique chemical (electroless plating) solution containing salts of calcium (Ca) and copper (Cu), their complexing agents, a reducing agent, a pH adjuster, and surfactants; and a semiconductor device thereby formed. The present invention further provides a particular method which controls the parameters of pH, temperature, and time in order to form a uniform conformal Cu-rich Cu—Ca—O thin film for reducing electromigration in Cu interconnect lines by decreasing the drift velocity therein which decreases the Cu migration rate in addition to decreasing the void formation rate. The Cu—Ca—O thin film may also comprise incidental contaminants such as carbon (C) and sulphur (S).

More specifically, the present invention provides a method for forming a semiconductor device having a copper-calcium-oxide (Cu—Ca—O) thin film on a copper (Cu) surface, the Cu surface having been formed by CVD, PVD, or electroplating, by treating the Cu surface in a chemical solution, comprising the steps of: (1) providing the chemical solution, the chemical solution comprising: (a) at least one calcium (Ca) ion source for providing a plurality of Ca ions; (b) at least one complexing agent for complexing the plurality of Ca ions; (c) at least one copper (Cu) ion source for providing a plurality of Cu ions; (d) at least one complexing agent for complexing the plurality of Cu ions; (e) at least one pH adjuster; (f) at least one reducing agent for facilitating deposition of the plurality of Cu ions; (g) at least one wetting agent for stabilizing the chemical solution; and (h) a volume of water, (a) through (g) being dissolved in (h); (2) immersing the Cu surface in said chemical solution, thereby forming the Cu—Ca—O thin film on the Cu surface; and (3) rinsing the Cu—Ca—O thin film formed on the Cu surface in water; drying the the Cu—Ca—O thin film formed on the Cu surface under a gaseous nitrogen flow ($GN_2$); and completing formation of the semiconductor device. By forming this Cu—Ca—O thin film on the Cu surface, the present invention improves Cu interconnect reliability, enhances electromigration resistance, and improves corrosion resistance.

DESCRIPTION OF THE DRAWINGS

For a better understanding of the present invention, reference is made to the below-referenced accompanying drawings.

Reference numbers refer to the same or equivalent parts of the present invention throughout the several figures of the drawings.

DETAILED DESCRIPTION OF THE INVENTION

Figure 1:
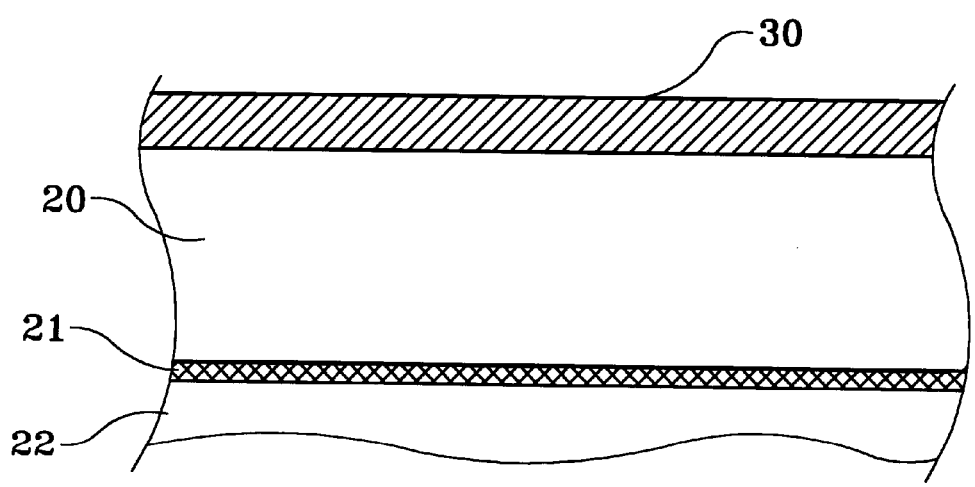
FIG. 1 is a cross-sectional view of a semiconductor device comprising a Cu—Ca—O thin film deposited and disposed on an upper surface of a Cu interconnect, an optional tantalum (Ta) barrier layer disposed on the interconnect's lower surface, and a dielectric layer disposed below the optional Ta barrier layer, in accordance with the present invention.

FIG. 1 illustrates, in cross-section, a Cu surface 20 having been deposited with a Cu—Ca—O thin film 30, in accordance with the present invention. FIG. 1 illustrates, in cross-section, a semiconductor device comprising a Cu—Ca—O thin film 30 deposited and disposed on an upper surface of a Cu interconnect 20, an optional tantalum (Ta) barrier layer 21 disposed on the interconnect's lower surface, and a dielectric layer 22 disposed below the optional Ta barrier layer, in accordance with the present invention.

Figure 2:
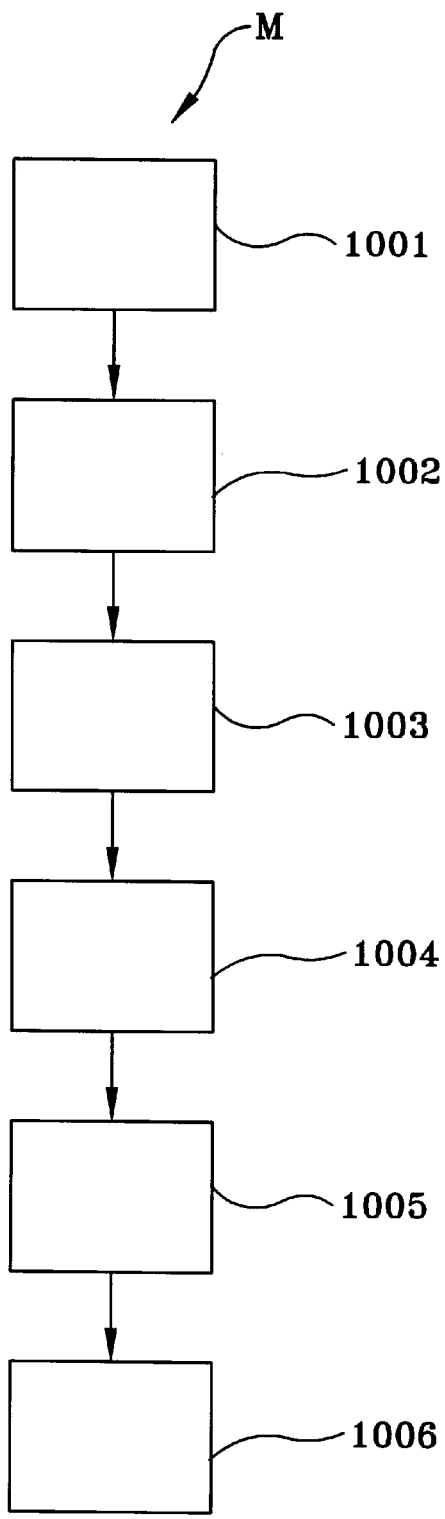
FIG. 2 is a flowchart of a method for synthesizing a unique electroless Cu plating (chemical) solution, in accordance with the present invention.

FIG. 2 illustrates, by flowchart, a method M for forming a copper-calcium-oxide (Cu—Ca—O) thin film 30 on a copper (Cu) surface 20, having been formed by CVD, PVD, or electroplating, by treating the Cu surface 20 in a chemical solution 1000, comprising the steps of: (1) providing the chemical solution 1000, the chemical solution comprising: (a) at least one calcium (Ca) ion source 40 for providing a plurality of Ca ions 45; (b) at least one complexing agent 50 for complexing the plurality of Ca ions 45; (c) at least one copper (Cu) ion source 60 for providing a plurality of Cu ions 65; (d) at least one complexing agent 70 for complexing the plurality of Cu ions 65; (e) at least one pH adjuster 80; (f) at least one reducing agent 90 for facilitating deposition of the plurality of Cu ions 65; (g) at least one wetting agent 100 for stabilizing the chemical solution 1000; and (h) a volume of water 110, (a) through (g) being dissolved in (h), as shown by block 1001; (2) immersing the Cu surface 20 in the chemical solution 1000, as shown by block 1002, thereby forming the Cu—Ca—O thin film 30 on the Cu surface 20, as shown by block 1003; and (3) rinsing the Cu—Ca—O thin film 30 formed on the Cu surface 20 in water, as shown by block 1004; and drying the the Cu—Ca—O thin film 30 formed on the Cu surface 20 under a gaseous nitrogen flow ($GN_2$), as shown by block 1005; and completing formation of the semiconductor device, as shown by block 1006.

In addition, the present invention chemical solution may be formulated as follows: wherein the at least one calcium (Ca) ion source comprises calcium carbonate ($CaCO_3$), wherein the at least one complexing agent for complexing the plurality of Ca ions comprises tartaric acid ($HO_2CCH(OH)CH(OH)CO_2H$), wherein the tartaric acid prevents precipitation of the plurality of Ca ions from the chemical solution, wherein the at least one copper (Cu) ion source comprises copper sulfate ($CuSO_4$), wherein the at least one complexing agent for the plurality of Cu ions comprises ethylenediaminetetraacetic acid "EDTA" (($HO_2CCH_2)_2NCH_2CH_2N(CH_2CO_2H)_2$), wherein the EDTA prevents precipitation of the plurality of Cu ions from the chemical solution, wherein the at least one pH adjuster comprises at least one pH-adjusting compound selected from a group of pH-adjusting compounds consisting essentially of potassium hydroxide (KOH) and tetramethylammonium hydroxide "TMAH" (($CH_3)_4NOH$), wherein the at least one reducing agent for facilitating deposition of the plurality of Cu ions comprises at least one reducing agent compound selected from a group of reducing agent compounds consisting essentially of formaldehyde ($CH_2O$) and glyoxylic acid ($HCOCO_2H$), wherein the at least one wetting agent comprises a surfactant, and wherein the surfactant comprises at least one surfactant selected from a group of surfactants consisting essentially of RE-610™ and Triton™.

In the preferred embodiment of the chemical solution, the composition is formulated with component concentration ranges as follows: wherein the at least one calcium (Ca) ion source is provided in a concentration range of 0.2 g/L–0.4 g/L, wherein the at least one complexing agent for complexing the plurality of Ca ions is provided in a concentration range of 4 g/L–15 g/L, wherein the at least one copper (Cu) ion source is provided in a concentration range of 5 g/L–10 g/L, wherein the at least one complexing agent for complexing the plurality of Cu ions is provided in a concentration range of 10 g/L–20 g/L, wherein the at least one pH adjuster is provided in a concentration range of 20 g/L–25 g/L, wherein the at least one reducing agent is provided in a concentration range of 3 g/L–5 g/L, wherein the at least one wetting agent is provided in a concentration range of 0.01 g/L–0.03 g/L, and wherein the volume of water is provided in a volume range of up to and including 1 L. In addition, the preferred embodiment also performed with the process parameters in the following ranges: wherein the at least one pH adjuster adjusts the chemical solution to a pH in a range of 12 to 14, wherein the chemical solution is maintained in a temperature range of 60° C. to 70° C., wherein the Cu surface is immersed for a time duration in a range of 30 seconds to 2 minutes, wherein the Cu—Ca—O thin film is formed having a thickness in a range of 50 Å to 150 Å, and wherein the formed Cu—Ca—O thin film is Cu-rich in a concentration range of at least 70 atomic %.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed:

1. A method of fabricating a copper-calcium-oxide (Cu—Ca—O) thin film on a copper (Cu) surface formed on a semiconductor device by treating the Cu surface in a chemical solution, comprising the steps of:
   (1) providing the semiconductor substrate;
   (2) providing the chemical solution, the chemical solution comprising:
      a. at least one calcium (Ca) ion source for providing a plurality of Ca ions;
      b. at least one complexing agent for complexing the plurality of Ca ions;
      c. at least one copper (Cu) ion source for providing a plurality of Cu ions;
      d. at least one complexing agent for complexing the plurality of Cu ions;
      e. at least one pH adjuster;
      f. at least one reducing agent for facilitating deposition of the plurality of Cu ions;
      g. at least one wetting agent for stabilizing the chemical solution; and
      h. a volume of water,
      (a) through (g) being dissolved in (h);
   (3) immersing the Cu surface in the chemical solution, thereby forming the Cu—Ca—O thin film on the Cu surface;
   (4) rinsing the Cu—Ca—O thin film formed on the Cu surface in water;
   (5) drying the Cu—Ca—O thin film formed on the Cu surface under a gaseous nitrogen flow ($GN_2$); and
   (6) completing formation of the semiconductor device.

2. The method, as recited in claim 1,
   wherein the at least one calcium (Ca) ion source comprises calcium carbonate ($CaCO_3$).

3. The method, as recited in claim 1,
   wherein the at least one complexing agent for complexing the plurality of Ca ions comprises tartaric acid ($HO_2CCH(OH)CH(OH)CO_2H$), and
   wherein the tartaric acid prevents precipitation of the plurality of Ca ions from the chemical solution.

4. The method, as recited in claim 1,
   wherein the at least one copper (Cu) ion source comprises copper sulfate ($CuSO_4$).

5. The method, as recited in claim 1,
   wherein the at least one complexing agent for the plurality of Cu ions comprises ethylenediaminetetraacetic acid "EDTA" (($HO_2CCH_2)_2NCH_2CH_2N(CH_2CO_2H)_2$), and
   wherein the EDTA prevents precipitation of the plurality of Cu ions from the chemical solution.

6. The method, as recited in claim 1,
   wherein the at least one pH adjuster comprises at least one pH-adjusting compound selected from a group of pH-adjusting compounds consisting essentially of potassium hydroxide (KOH) and tetramethylammonium hydroxide "TMAH" (($CH_3)_4NOH$).

7. The method, as recited in claim 1,
   wherein the at least one reducing agent for facilitating deposition of the plurality of Cu ions comprises at least one reducing agent compound selected from a group of reducing agent compounds consisting essentially of formaldehyde ($CH_2O$) and glyoxylic acid ($HCOCO_2H$).

8. The method, as recited in claim 1,
   wherein the at least one wetting agent comprises a surfactant, and
   wherein the surfactant comprises at least one surfactant selected from a group of surfactants consisting essentially of RE-610™ and Triton™.

9. The method, as recited in claim 1,
   wherein the Cu surface is formed by a process selected from a group of processes consisting essentially of chemical vapor deposition (CVD), plasma vapor deposition (PVD), electroplating, and electroless plating.

10. The method as recited in claim 1,
   wherein the at least one calcium (Ca) ion source is provided in a concentration range of 0.2 g/L–0.4 g/L,
   wherein the at least one complexing agent for complexing the plurality of Ca ions is provided in a concentration range of 4 g/L–15 g/L,
   wherein the at least one copper (Cu) ion source is provided in a concentration range of 5 g/L–10 g/L,
   wherein the at least one complexing agent for complexing the plurality of Cu ions is provided in a concentration range of 10 g/L–20 g/L,
   wherein the at least one pH adjuster is provided in a concentration range of 20 g/L–25 g/L,
   wherein the at least one reducing agent is provided in a concentration range of 3 g/L–5 g/L,
   wherein the at least one wetting agent is provided in a concentration range of 0.01 g/L–0.03 g/L, and
   wherein the volume of water is provided in a volume range of up to and including 1 L,
   wherein the at least one pH adjuster adjusts the chemical solution to a pH in a range of 12 to 14,
   wherein the chemical solution is maintained at a temperature in a range of 60° C. to 70° C.,
   wherein the Cu surface is immersed for a time duration in a range of 30 seconds to 2 minutes,
   wherein the Cu—Ca—O thin film is formed having a thickness in a range of 50 Å to 150 Å, and
   wherein the formed Cu—Ca—O thin film is Cu-rich in a concentration range of at least 70 atomic %.

* * * * *